(12) United States Patent
Iida et al.

(10) Patent No.: US 12,520,423 B2
(45) Date of Patent: Jan. 6, 2026

(54) METHOD FOR MANUFACTURING CIRCUIT BOARD

(71) Applicant: FICT LIMITED, Nagano (JP)

(72) Inventors: Kenji Iida, Nagano (JP); Norikazu Ozaki, Nagano (JP); Taiji Sakai, Nagano (JP); Takashi Nakagawa, Nagano (JP); Kenji Takano, Nagano (JP)

(73) Assignee: FICT LIMITED, Nagano (JP)

( * ) Notice: Subject to any disclaimer, the term of this patent is extended or adjusted under 35 U.S.C. 154(b) by 194 days.

(21) Appl. No.: 18/285,910

(22) PCT Filed: Feb. 14, 2022

(86) PCT No.: PCT/JP2022/005608
§ 371 (c)(1),
(2) Date: Oct. 6, 2023

(87) PCT Pub. No.: WO2022/224557
PCT Pub. Date: Oct. 27, 2022

(65) Prior Publication Data
US 2024/0188216 A1 Jun. 6, 2024

(30) Foreign Application Priority Data
Apr. 20, 2021 (JP) ................. 2021-071250

(51) Int. Cl.
| H05K 3/46 | (2006.01) |
| H05K 1/11 | (2006.01) |
| H05K 3/38 | (2006.01) |

(52) U.S. Cl.
CPC ............. *H05K 1/116* (2013.01); *H05K 3/382* (2013.01); *H05K 3/4652* (2013.01);
(Continued)

(58) Field of Classification Search
CPC ......... H05K 1/116; H05K 2201/09509; H05K 2201/096; H05K 2201/09827;
(Continued)

(56) References Cited

U.S. PATENT DOCUMENTS

| 6,440,542 B1 * | 8/2002 | Kariya | ................. H05K 3/0035 174/262 |
| 7,523,545 B2 * | 4/2009 | Kumar | ................. H05K 3/4623 29/830 |

(Continued)

FOREIGN PATENT DOCUMENTS

| JP | 2003-8225 A | 1/2003 |
| JP | 2004-128170 A | 4/2004 |

(Continued)

OTHER PUBLICATIONS

Office Action dated Nov. 26, 2024, issued in KR Application No. 10-2023-7030737, with English translation. (11 pages).

(Continued)

*Primary Examiner* — Donghai D Nguyen
(74) *Attorney, Agent, or Firm* — WHDA, LLP

(57) ABSTRACT

The present invention addresses the problem of providing a circuit board for which the manufacturing process is short and which has a laminate surface having uniform flatness. As a solution to the problem, this method for manufacturing a circuit board includes: manufacturing a three-layer metal (58) having, on one surface thereof, a first metal layer (26) formed in a pattern shape; manufacturing unit structures (60) each having the first metal layer (26), a cured first insulating base material (22) filled with a cured first conductive paste (32), a second metal layer (28), and a semi-cured second insulating base material (24) filled with a semi-cured second conductive paste (36); joining together the first insulating base material (22) in one unit structure (60) among a plurality of the unit structures with the second insulating (Continued)

base material (24) in another unit structure (60); and layering the plurality of unit structures (60).

4 Claims, 13 Drawing Sheets

(52) U.S. Cl.
CPC . *H05K 3/4682* (2013.01); *H05K 2201/09509* (2013.01); *H05K 2201/096* (2013.01)

(58) Field of Classification Search
CPC ...... H05K 1/115; H05K 3/382; H05K 3/4652; H05K 3/4682; H05K 3/4623; H05K 3/0035; H05K 3/06; H05K 3/4069; H05K 2203/061; H05K 3/0094; H05K 3/4655; Y10T 29/49128; Y10T 29/49155; Y10T 29/49165
See application file for complete search history.

(56) References Cited

U.S. PATENT DOCUMENTS

| | | | |
|---|---|---|---|
| 8,481,424 B2 * | 7/2013 | Takahashi | H05K 1/115 257/774 |
| 8,525,356 B2 * | 9/2013 | Nakamura | H05K 3/10 257/E23.179 |
| 8,754,336 B2 * | 6/2014 | Kaneko | H05K 1/113 361/767 |
| 2010/0175806 A1 | 7/2010 | Shiraishi et al. | |
| 2016/0338193 A1 * | 11/2016 | Kanai | H05K 3/06 |
| 2022/0061158 A1 * | 2/2022 | Jung | H05K 3/4623 |

FOREIGN PATENT DOCUMENTS

| | | | |
|---|---|---|---|
| JP | 2004-158671 A | | 6/2004 |
| JP | 2005072328 A | * | 3/2005 |
| JP | 2006-66738 A | | 3/2006 |
| JP | 2006-210524 A | | 8/2006 |
| JP | 2010-161298 A | | 7/2010 |
| JP | 2017-54964 A | | 3/2017 |
| KR | 10-2015-0013008 A | | 2/2015 |
| KR | 10-2020-0070773 A | | 6/2020 |

OTHER PUBLICATIONS

International Search Report dated Apr. 19, 2022, issued in counterpart International Application No. PCT/JP2022/005608, with English Translation. (4 pages).

* cited by examiner

METHOD FOR MANUFACTURING CIRCUIT BOARD

TECHNICAL FIELD

The present invention relates to a circuit board, a method for manufacturing a circuit board, and an electronic device using a circuit board.

BACKGROUND ART

Conventionally, circuit boards such as printed wiring boards have been widely used to compactly incorporate electronic components into electronic devices. A printed wiring board, which is obtained by etching a copper foil bonded to a laminate in accordance with an electronic circuit pattern, is advantageous in terms of cost, although it is difficult to mount electronic components on the printed circuit board at high density.

On the other hand, along with the demand for miniaturization, higher performance, and lower cost of electronic devices, finer electronic circuits on circuit boards, multilayering, and higher density packaging of electronic components have been rapidly evolving. As such, the use of multilayer printed wiring boards as circuit boards has been actively contemplated.

When manufacturing a multilayer printed wiring board, which is a circuit board having a multilayer structure, multiple insulating base materials on which wiring patterns are formed are bonded using an adhesive layer, as in PTL 1 (JP-A-2006-66738).

PTL 2 (JP-A-2004-158671) proposes, as a multilayer wiring board, a build-up multilayer wiring board that is formed by laminating, on both sides of the core material as the base, conductor patterns on substrate layers of an insulating material in the order in which the conductor patterns are formed.

CITATION LIST

Patent Literature

PTL 1: JP-A-2006-66738
PTL 2: JP-A-2004-158671

SUMMARY OF INVENTION

Technical Problem

When multiple substrates are bonded by providing an adhesive layer as in PTL 1, the adhesive layer is primarily a material that is not needed for the manufactured multilayer printed wiring board. In some cases, the electrical characteristics are not satisfactory for substrates for high-speed transmission. Also, there is a problem of substantial wastage in terms of cost. Furthermore, a build-up multilayer wiring board such as that of PTL 2 requires a very long time for manufacturing process. As for yields, the yield per layer is reflected in the overall yield as the multiplier with respect to the number of layers when there are multiple layers. This causes a problem of high manufacturing cost.

Additionally, with conventional multilayer circuit boards, when an insulating base material is laminated on a metal layer, the flatness of the surface of the laminated insulating base material may vary. This causes problems of misalignment between layers after lamination, leakage of the conductive paste, voids, and the like.

Solution to Problem

To solve the above issues, it is an object of the present invention to provide a circuit board, a method for manufacturing a circuit board, and an electronic device with which an adhesive layer is not used, the manufacturing process is short, and the plate thickness distribution and the flatness of the laminated surfaces are uniform.

A circuit board according to the present invention includes a plurality of first insulating base materials and a plurality of second insulating base materials that are alternately laminated, a first metal layer being formed into a pattern shape on a first surface of the first insulating base material, a second metal layer being formed into a pattern shape on a second surface of the first insulating base material. The circuit board also includes a first conductive paste being filled into a through hole of the first insulating base material so as to connect the first metal layer and the second metal layer, and a second conductive paste being filled into a through hole of the second insulating base material so as to connect the second metal layer of the first insulating base material that is laminated on a first surface side of the second insulating base material, and the first metal layer of the first insulating base material that is laminated on a second surface side of the second insulating base material. The first metal layer is embedded in the first surface of the first insulating base material. The first metal layer is formed into a trapezoidal shape in which diameter decreases from the side corresponding to the first surface of the first insulating base material toward the side corresponding to the second surface of the first insulating base material. The second metal layer is embedded in the first surface of the second insulating base material. The second metal layer is formed into a trapezoidal shape in which diameter decreases from the side corresponding to the first surface of the second insulating base material toward the side corresponding to the second surface of the second insulating base material. The first metal layers and the second metal layers are laminated in such a manner that the trapezoidal shapes are in a same orientation.

According to the above, a multilayer circuit board can be constructed without an adhesive layer, so that it is possible to improve the electrical characteristics, shorten the manufacturing process, improve the yield, and reduce the cost.

Also, an arithmetic average roughness (Ra) of surfaces of the first metal layers on which the first insulating base material and the second insulating base material are laminated may be 1.0 μm to 2.0 μm, and the arithmetic average roughness (Ra) of surfaces of the second metal layers on which the second insulating base materials are laminated may be 1.0 μm to 2.0 μm.

This has the advantageous effects of preventing abnormality in the resistance value and delamination when the conductive paste in a semi-cured state (not cured) is laminated on metal layers.

A method for manufacturing a circuit board according to the present invention includes a process of manufacturing a first metal layer being formed into a pattern shape by disposing, on a surface of a first metal foil that is opposite to a surface on which a first insulating base material is to be laminated, a third metal layer containing a metal that is different from the first metal foil and a fourth metal layer in succession and etching the first metal foil from a direction in which the first insulating base material is laminated, a process of removing a portion of the third metal layer by etching from the direction in which the first insulating base material is laminated, a process of manufacturing a cured first insulating base material in which the first metal layer being formed into a pattern shape is disposed at a first surface, a second metal layer being formed into a pattern shape is disposed at a second surface, and a first through hole that is formed between the first metal layer and the second metal layer is filled with a first conductive paste that connects the first metal layer and the second metal layer, a process of removing the entire fourth metal layer by etching, a process of removing the entire third metal layer by etching, a process of manufacturing a unit component including the first insulating base material and a semi-cured second insulating base material that is disposed on a side of the first insulating base material corresponding to the second surface and in which a second through hole communicating with the second metal layer is filled with a second conductive paste connected to the second metal layer, and a process of laminating a plurality of the unit components by joining to one another the first insulating base material of one of the plurality of the unit components and the second insulating base material of another unit component of the plurality of the unit components.

By adopting the above method, a multilayer circuit board is manufactured by manufacturing a plurality of unit components and laminating the unit components, thereby shortening the manufacturing process and reducing the cost. Also, providing the third metal layer has an advantageous effect in that the fourth metal layer is not etched because the third metal layer functions as barrier metal when the first metal foil is etched for the patterning of the first metal layer. Furthermore, providing the fourth metal layer limits variations in plate thickness distribution and flatness of the laminated surfaces. As such, when the first metal foil has the third metal layer and the fourth metal layer, it is possible to prevent misalignment between layers after lamination, leakage of the conductive paste, voids, and the like.

Also, the method may further include a process of performing surface roughening on a surface of the first metal layer on which the first insulating base material is to be laminated and a surface of the fourth metal layer on which the first insulating base material is to be laminated such that an arithmetic average roughness (Ra) of the surface of the first metal layer and the surface of the fourth metal layer is 1.0 μm to 2.0 μm, and a process of performing surface roughening on a surface of the first metal layer on which the second insulating base material is to be laminated and a surface of the second metal layer on which the second insulating base material is to be laminated such that an arithmetic average roughness (Ra) of the surface of the first metal layer and the surface of the second metal layer is 1.0 μm to 2.0 μm.

This has an advantageous effect of preventing abnormality in the resistance value and delamination when the conductive paste in a semi-cured state (not cured) is laminated on metal layers.

Furthermore, the first metal layer is formed into a trapezoidal shape in which a diameter decreases from a side corresponding to the first surface of the first insulating base material toward a side corresponding to the second surface, and the second metal layer is formed into a trapezoidal shape in which a diameter decreases from a side corresponding to the first surface of the second insulating base material toward a side corresponding to the second surface.

Additionally, in the process of manufacturing the unit component, the first metal layer of the unit component may be embedded in the first insulating base material, and the second metal layer of the unit component may be embedded in the second insulating base material.

An electronic device according to the present invention includes the circuit board according to claim 1 or claim 2 and an electronic component.

Advantageous Effects of Invention

According to the present invention, a multilayer circuit board can be constructed by manufacturing a plurality of unit components and laminating the plurality of unit components, thereby shortening the manufacturing process, improving the yield, and reducing the cost. In addition, since the first metal layer has the third metal layer and the fourth metal layer disposed in succession on the surface opposite to the surface on which the first insulating base material is laminated, it is possible to prevent misalignment between layers after lamination, leakage of the conductive paste, voids, and the like.

DESCRIPTION OF EMBODIMENTS (Circuit Board)

Figure 1:
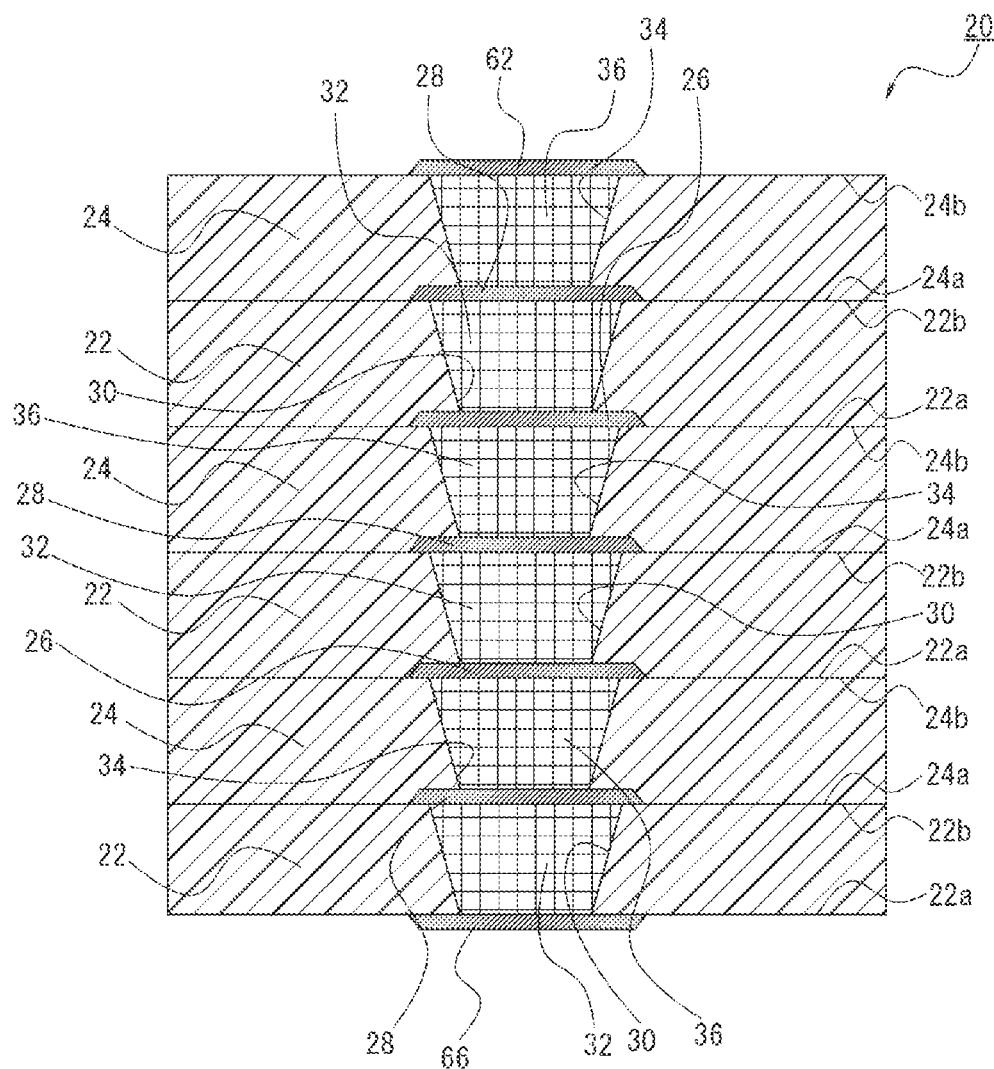
FIG. 1 is a schematic cross-sectional view showing an example of a circuit board.

FIG. 1 shows a schematic cross-sectional view of a circuit board 20. The circuit board 20 of the present embodiment is configured by alternately laminating first insulating base materials 22 and second insulating base materials 24 without an adhesive layer. A first metal layer 26 is formed into a pattern shape on a first surface 22a of a first insulating base material 22, and the first metal layer 26 is embedded in the first insulating base material 22. A fifth metal layer 66 is formed into a pattern shape on the first surface 22a of the first insulating base material 22 of the lowest layer, and the fifth metal layer 66 is exposed from the first insulating base material 22. A second metal layer 28 is formed into a pattern shape on a second surface 22b opposite to the first surface 22a. The second metal layer 28 is exposed from the first insulating base material 22 and is embedded in the second insulating base material 24.

Each first insulating base material 22 includes a through hole 30, which opens at the side corresponding to the first metal layer 26 or the side corresponding to the fifth metal layer 66 and at the side corresponding to the second metal layer 28 to provide communication between the first metal layer 26 or the fifth metal layer 66 and the second metal layer 28. The through hole 30 is filled with a first conductive paste 32, which electrically connects the first metal layer 26 or the fifth metal layer 66 and the second metal layer 28. In this embodiment, the through hole 30 is formed such that the diameter gradually increases from the first surface 22a toward the second surface 22b, and the first conductive paste 32 has a cone shape.

The second insulating base material 24 is disposed on the side of each first insulating base material 22 corresponding to the second surface 22b. At a first surface 24a of the second insulating base material 24 (that is, at the side of the second insulating base material 24 corresponding to the facing surface facing the first insulating base material 22), the second metal layer 28 that is formed on the second surface 22b of the first insulating base material 22 is embedded in the second insulating base material 24.

At the side of the second insulating base material 24 corresponding to the second surface 24b, that is, at the upper side in FIG. 1, the first metal layer 26 that is formed at the first surface 22a of the first insulating base material 22 located above the second insulating base material 24 is embedded in the first insulating base material 22.

Each second insulating base material 24 includes a through hole 34, which opens at the side corresponding to the second metal layer 28 and the side corresponding to the first metal layer 26 to provide communication between the embedded second metal layer 28 and the first metal layer 26 that is embedded in the first insulating base material 22 located above the second insulating base material 24. The through hole 34 is filled with a second conductive paste 36, which electrically connects the second metal layer 28 and the first metal layer 26. In this embodiment, the through hole 34 is formed such that the diameter gradually increases from the first surface 24a toward the second surface 24b of the second insulating base material 24, and the second conductive paste 36 has a cone shape.

Each first metal layer 26 has a trapezoidal shape in which the diameter is large at the side corresponding to the first surface 22a of the first insulating base material 22 and small at the side corresponding to the second surface 22b of the first insulating base material 22. Each second metal layer 28 has a trapezoidal shape in which the diameter is large at the side corresponding to the first surface 24a of the second insulating base material 24 and small at the side corresponding to the second surface 24b of the second insulating base material 24. In contrast, the fifth metal layer 66 has a trapezoidal shape in which the diameter is large at the side corresponding to the first surface 22a of the first insulating base material 22 and is exposed downward. The first metal layers 26 and the second metal layers 28 uniformly have a trapezoidal shape of the same orientation. The fifth metal layer 66 has a trapezoidal shape of an orientation that is reversed from the orientation of the first metal layers 26 and the second metal layers 28.

The metal layers 26 and 28 on both sides of the first insulating base materials 22 have a trapezoidal shape in which the diameter decreases upward. This is because the metal layers 26 and 28 are etched from above in the laminating direction in the manufacturing process. The fifth metal layer 66 has a trapezoidal shape in which the diameter decreases downward. This is because the fifth metal layer 66 is etched from below in the laminating direction in the manufacturing process.

In the circuit board 20 of the present embodiment, the first insulating base materials 22 and the second insulating base materials 24 are alternately laminated, the first metal layers 26 that are provided at the boundaries between the first insulating base materials 22 and the second insulating base materials 24 are embedded in the first insulating base materials 22, the second metal layers 28 are embedded in the second insulating base materials 24, and the fifth metal layer 66 is exposed from the first insulating base material 22.

Preferably, an arithmetic average roughness (Ra) of the surfaces of the first metal layers 26 (the sides corresponding to the first conductive paste 32 and the second conductive paste 36), a surface of the fifth metal layer 66 (the side corresponding to the first conductive paste 32), and surfaces of the second metal layers 28 (the sides corresponding to the second conductive paste 36) is 1.0 μm to 2.0 μm. This has the advantageous effects of preventing abnormality in the resistance value and delamination when the conductive paste 32 and 36 in a semi-cured state (not cured) is laminated.

(Method for Manufacturing Circuit Board)

Figure 2:
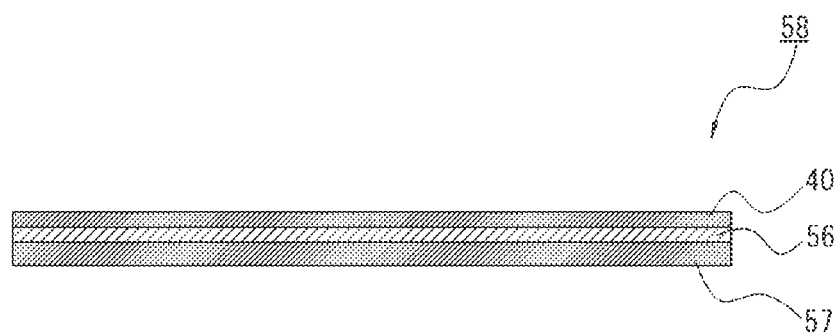
FIG. 2 is a schematic cross-sectional view (No. 1) showing an example of a method for manufacturing a circuit board.

Referring to FIGS. 2 to 25, a method for manufacturing a circuit board is now described. First, as shown in FIG. 2, reference numeral 58 denotes a three-layer metal 58 including a third metal layer 56 and a fourth metal layer 57 arranged in succession on one surface of a first metal foil 40.

As the first metal foil 40 and the fourth metal layer 57 of the three-layer metal 58, general copper foils can be used, but they are not particularly limited to copper foils, and various metal foils can be selected as appropriate depending on the purpose. However, although the same kind of metal foil can be used for the first metal foil 40 and the fourth metal layer 57, the first metal foil 40 and the third metal layer 56 need to contain mutually different metals, and the fourth metal layer 57 and the third metal layer 56 need to contain mutually different metals because the first metal foil 40, the third metal layer 56, and the fourth metal layer 57 are independently etched as will be described below. In one example, when copper foil is used for the first metal foil 40 and the fourth metal layer 57, a nickel layer is used for the third metal layer 56.

Figure 3:
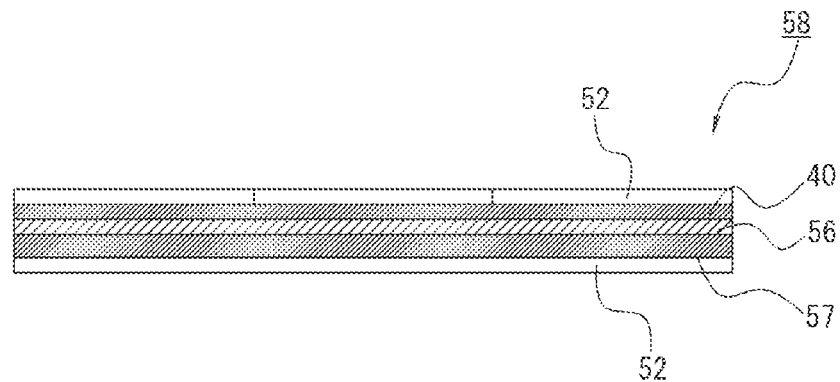
FIG. 3 is a schematic cross-sectional view (No. 2) showing an example of the method for manufacturing a circuit board.
Figure 4:
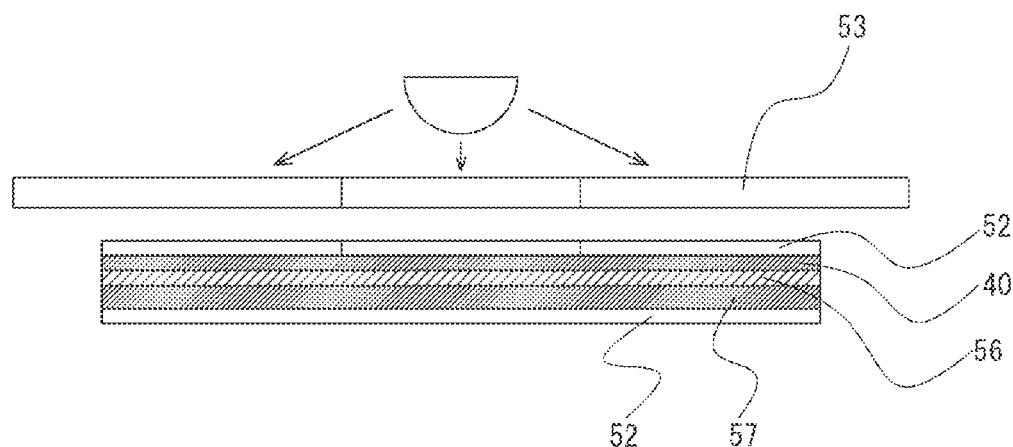
FIG. 4 is a schematic cross-sectional view (No. 3) showing an example of the method for manufacturing a circuit board.
Figure 5:
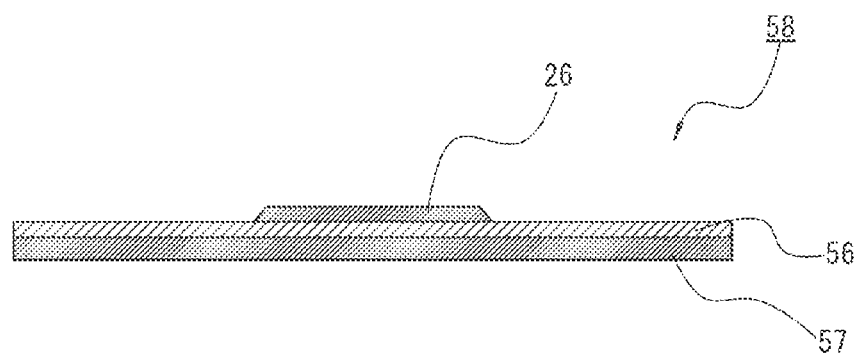
FIG. 5 is a schematic cross-sectional view (No. 4) showing an example of the method for manufacturing a circuit board.

Then, as shown in FIGS. 3 to 5, the first metal foil 40 is etched. The etching processing of this embodiment uses wet etching. Dry films 52 are affixed to the surfaces of the three-layer metal 58 (surfaces of the first metal foil 40 and the fourth metal layer 57), and the dry films 52 are exposed and developed through a photomask 53 to obtain the first metal layer 26 formed as a predetermined pattern. In this embodiment, the dry film 52 on the side of the three-layer metal 58 corresponding to the fourth metal layer 57 is not formed into a pattern shape. The etching processing that is applied to the three-layer metal 58 from above uses an etchant that acts only on the first metal foil 40. Additionally, the third metal layer 56 serves as barrier metal, so that the etching processing is not applied to the fourth metal layer 57. Thus, in this process, the fourth metal layer 57 is not etched.

In the etching processing, the first metal foil 40 is formed into a patterned first metal layer 26 in a trapezoidal shape. This is because the etching processing performs isotropic etching using chemicals. As shown in FIG. 5, the etching processing forms the first metal layer 26 having a trapezoidal shape in which the diameter is large at the side corresponding to the third metal layer 56 (the side of the first insulating base material 22 corresponding to the first surface 22a described below).

Figure 6:
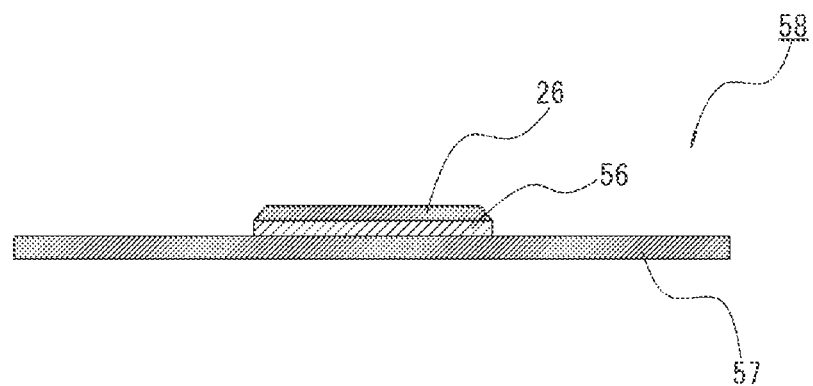
FIG. 6 is a schematic cross-sectional view (No. 5) showing an example of the method for manufacturing a circuit board.

Then, as shown in FIG. 6, the third metal layer 56 is etched. In this process, no dry film is attached to the surface of the three-layer metal 58, and an etchant that acts only on the third metal layer 56 (for example, the third metal layer 56 is a nickel layer) is used. This process leaves the third metal layer 56 only between the first metal layer 26 and the fourth metal layer 57 described above.

With the uppermost part of the three-layer metal 58 formed as the first metal layer 26, surface roughening is performed on the surface of the first metal layer 26 on the side corresponding to the first conductive paste 32 and the surface of the fourth metal layer 57 on the side corresponding to the first conductive paste 32. Preferably, the arithmetic average roughness (Ra) of the surface of the first metal layer 26 and the surface of the fourth metal layer 57 on the side corresponding to the first metal layer 26 that are subjected to the surface roughening is 1.0 μm to 2.0 μm. This has advantageous effects of preventing abnormality in the resistance value and delamination between the first metal layer 26 and the first conductive paste 32 when the through hole 30 is filled with the first conductive paste 32 as will be described below.

Figure 7:
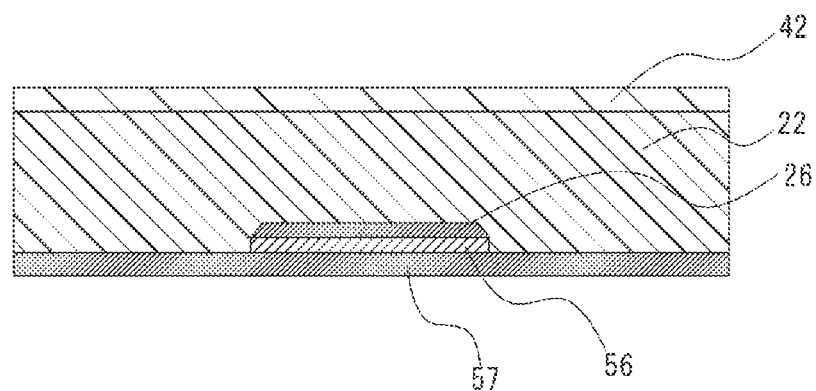
FIG. 7 is a schematic cross-sectional view (No. 6) showing an example of the method for manufacturing a circuit board.

Then, as shown in FIG. 7, a semi-cured (not cured) first insulating base material 22 is laminated on the three-layer metal 58, and a masking resin film 42 is laminated on the upper surface of the first insulating base material 22.

The first insulating base material 22 preferably contains thermosetting resin or thermoplastic resin. For example, a prepreg (obtained by impregnating a nonwoven fabric base material or nonwoven base material, such as glass fiber, with epoxy resin or the like) may be used. However, the resin of the first insulating base material 22 may be any insulating base material used for circuit boards, such as a bismaleimide triazine resin, which is a thermosetting resin, or a modified polyphenylene ether resin, which is a thermoplastic resin, for example.

Figure 8:
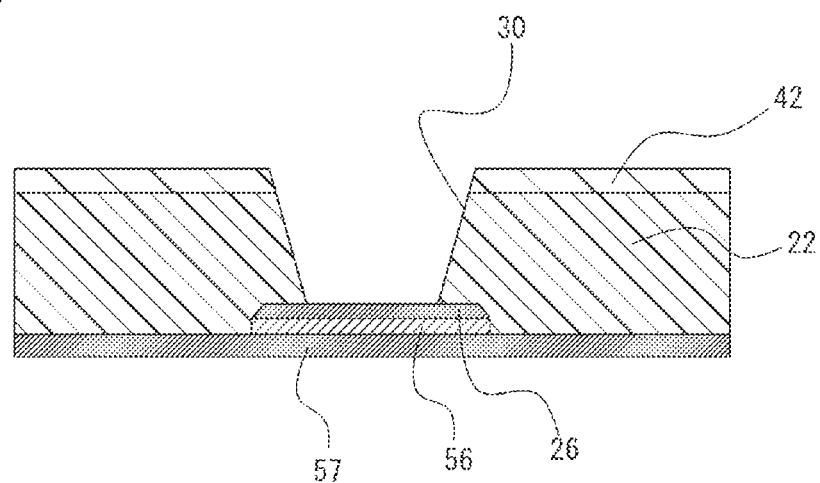
FIG. 8 is a schematic cross-sectional view (No. 7) showing an example of the method for manufacturing a circuit board.

FIG. 8 shows a state in which a through hole 30, which extends through the first insulating base material 22 in the thickness direction, is formed. The through hole 30 extends through the first insulating base material 22 and the resin film 42. The first metal layer 26 closes the bottom of the through hole 30. As a method for forming the through hole 30, a forming method using a laser is available, but the method is not limited to the forming method using a laser. Examples of types of laser that may be used to form the through hole 30 with laser include CO2 laser and YAG laser, and the laser type can be selected as appropriate. Also, there is no limitation to the laser output, and the output may be selected as appropriate.

Figure 9:
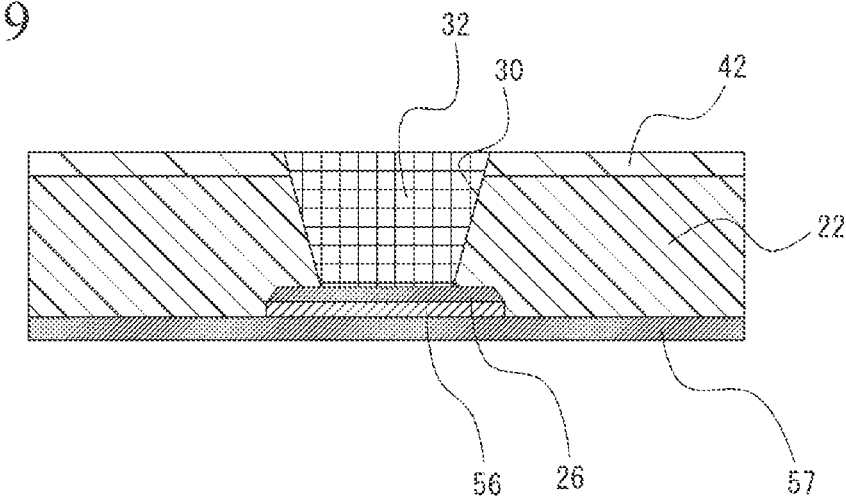
FIG. 9 is a schematic cross-sectional view (No. 8) showing an example of the method for manufacturing a circuit board.

FIG. 9 shows a state in which the through hole 30 is filled with the first conductive paste 32. As the first conductive paste 32, paste containing a conductive filler and a binder resin may be used. Examples of conductive fillers include particles of metals such as copper, gold, silver, palladium, nickel, tin, and bismuth. These metal particle types may be used alone or in combination of two or more. As the binder resin, an epoxy resin, which is a type of thermosetting resin, may be used. However, the material is not limited to epoxy resin, and polyimide resin or the like may be used. Also, the binder resin may be a thermoplastic resin instead of a thermosetting resin.

Examples of a method of filling the through hole 30 with the first conductive paste 32 include a method of filling the through hole 30 with the first conductive paste 32 under atmospheric pressure or under vacuum using a jig such as a squeegee.

Figure 10:
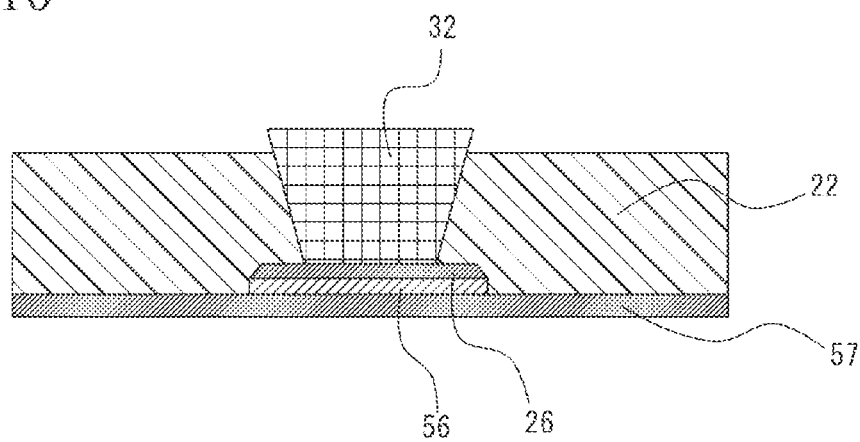
FIG. 10 is a schematic cross-sectional view (No. 9) showing an example of the method for manufacturing a circuit board.

FIG. 10 shows a state in which the resin film 42 is peeled off. When the resin film 42 is peeled off, the first conductive paste 32 protrudes from the opening of the second surface 22b of the first insulating base material 22 by the thickness of the resin film 42.

Figure 11:
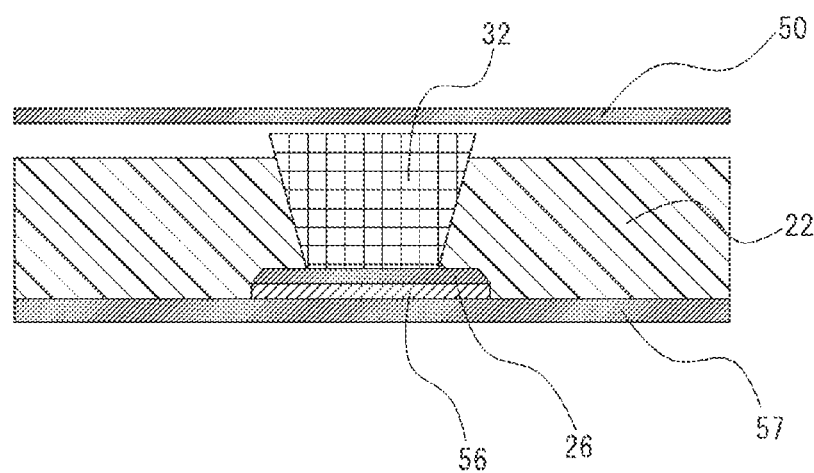
FIG. 11 is a schematic cross-sectional view (No. 10) showing an example of the method for manufacturing a circuit board.

FIG. 11 shows a state in which, after the resin film 42 is peeled off, the second metal foil 50 is placed on the upper surface (the surface opposite to the surface at which the first metal foil 40 is placed) of the first insulating base material 22. As the second metal foil 50, general copper foil can be used, but it is not particularly limited to copper foil, and various metal foils can be selected as appropriate depending on the purpose.

Figure 12:
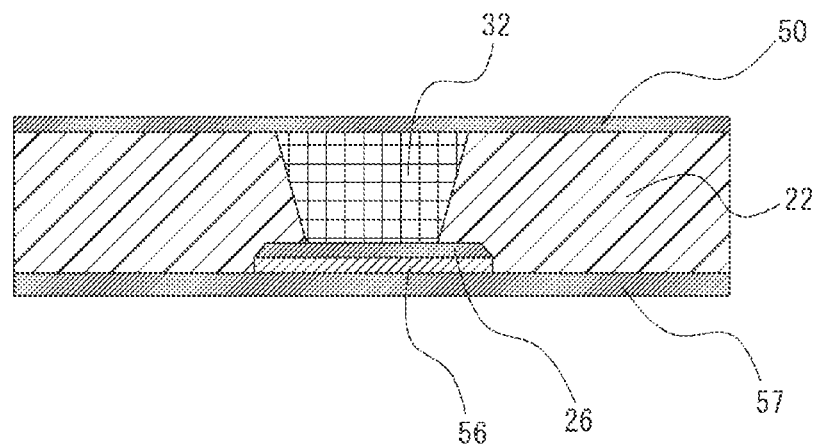
FIG. 12 is a schematic cross-sectional view (No. 11) showing an example of the method for manufacturing a circuit board.

As shown in FIG. 12, the first metal layer 26, the third metal layer 56, the fourth metal layer 57 and the second metal foil 50 are joined to the first insulating base material 22. The joining may be performed by thermocompression bonding or compression bonding, which cures the first conductive paste 32 and the first insulating base material 22. The temperature and pressure for thermocompression bonding and the pressure for compression bonding may be appropriately selected according to the materials of the first conductive paste 32 and the first insulating base material 22.

Figure 13:
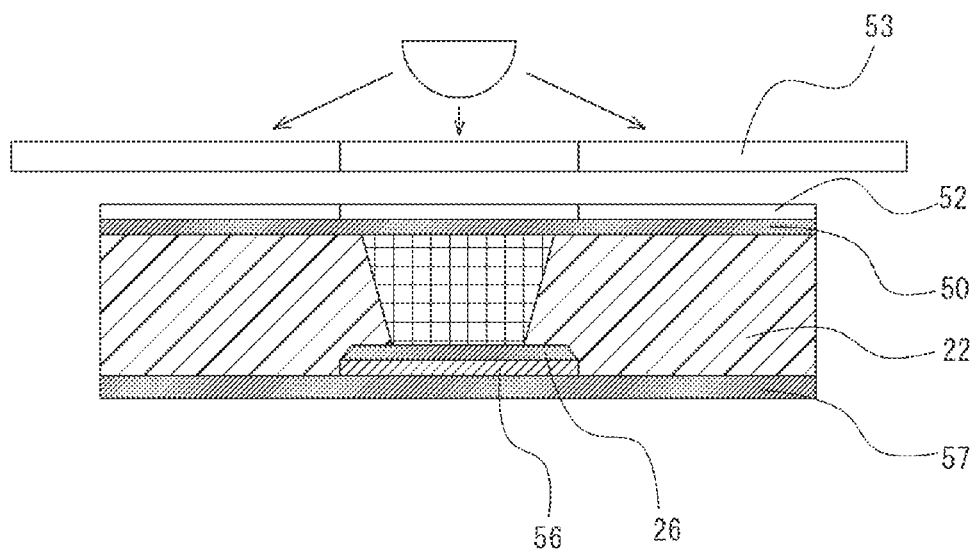
FIG. 13 is a schematic cross-sectional view (No. 12) showing an example of the method for manufacturing a circuit board.
Figure 14:
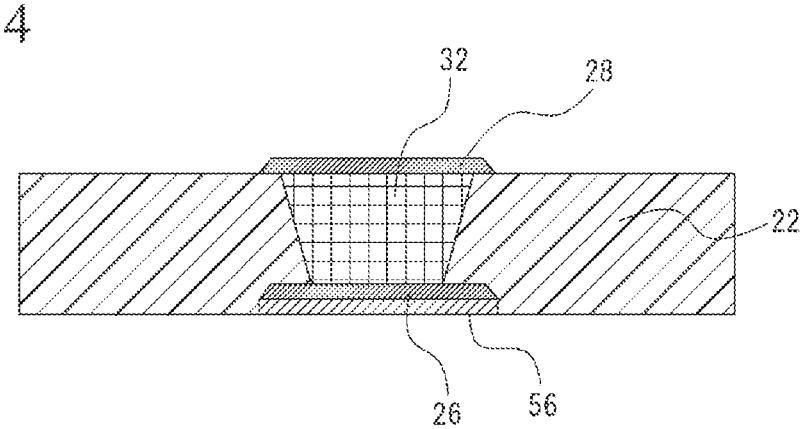
FIG. 14 is a schematic cross-sectional view (No. 13) showing an example of the method for manufacturing a circuit board.

As shown in FIG. 13, the second metal foil 50 on the upper surface of the first insulating base material 22 and the fourth metal layer 57 are then etched. The etching processing of this embodiment performs wet etching. The dry film 52 is affixed to the surface of the second metal foil 50, and the dry film 52 is exposed and developed through the photomask 53 to obtain the second metal layer 28 formed in a predetermined pattern, as shown in FIG. 14. The entire surface of the fourth metal layer 57 is etched by the etchant, so that the fourth metal layer 57 is removed. In the etching processing of this process, the third metal layer 56 serves as barrier metal, so that first metal layer 26 remains without being etched.

In the etching processing, the second metal foil 50 is formed into a patterned second metal layer 28 having a trapezoidal shape. This is because the etching processing performs isotropic etching using chemicals. As shown in FIG. 14, the etching processing forms the second metal layer 28 having a trapezoidal shape in which the diameter is large at the side corresponding to the second surface 22b of the first insulating base material 22.

Figure 15:
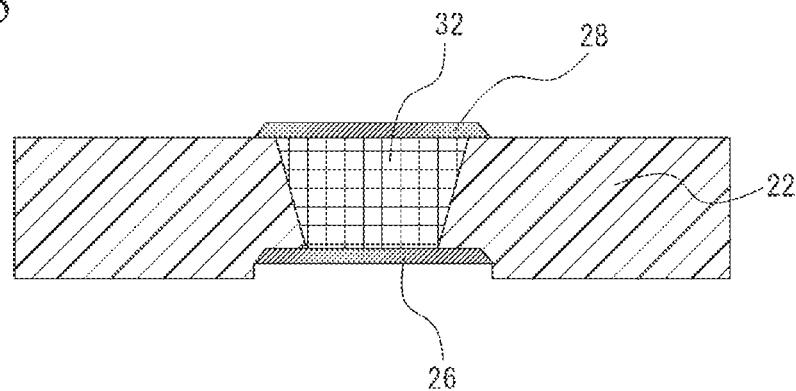
FIG. 15 is a schematic cross-sectional view (No. 14) showing an example of the method for manufacturing a circuit board.

Then, as shown in FIG. 15, the third metal layer 56 remaining from the previous process is etched. In this step, no dry film is affixed to the second metal layer 28, and an etchant that acts only on the third metal layer 56 (for example, the third metal layer 56 is a nickel layer) is used. This process removes the third metal layer 56, leaving only the patterned first metal layer 26 of the three-layer metal 58 formed in the first process.

Figure 16:
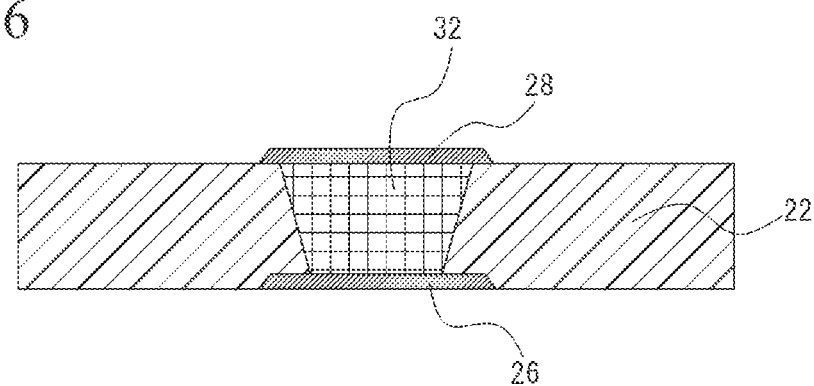
FIG. 16 is a schematic cross-sectional view (No. 15) showing an example of the method for manufacturing a circuit board.

With the first metal layer 26 and the second metal layer 28 formed at both sides of the first insulating base material 22 as shown in FIG. 16, surface roughening is performed on the surface of the first metal layer 26 on the side corresponding to the second conductive paste 36 and the surface of the second metal layer 28 on the side corresponding to the second conductive paste 36. Preferably, the arithmetic average roughness (Ra) of the surface of the first metal layer 26 and the surface of the second metal layer 28 side that are subjected to the surface roughening is 1.0 μm to 2.0 μm. This has advantageous effects of preventing abnormality in the resistance value and delamination between the first metal layers 26 and the second metal layers 28 and the second conductive paste 36 when the through holes 34 are filled with the second conductive paste 36 and when multiple unit components 60 are laminated, as will be described below.

Figure 17:
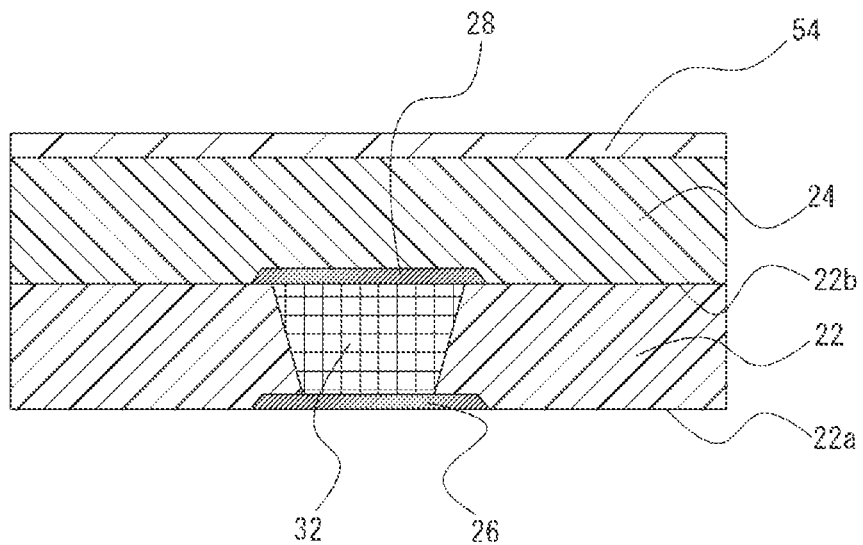
FIG. 17 is a schematic cross-sectional view (No. 16) showing an example of the method for manufacturing a circuit board.

FIG. 17 shows a state in which a semi-cured (not cured) second insulating base material 24 is laminated on the side of the first insulating base material 22 corresponding to the second surface 22b, and a resin film 54 is laminated on the surface of the second insulating base material 24. The material of the second insulating base material 24 may be the same as that of the first insulating base material 22 and preferably contains thermosetting resin or thermoplastic resin. For example, a prepreg (obtained by impregnating a nonwoven fabric base material or woven fabric base material, such as glass fiber, with epoxy resin or the like) may be used. However, the resin of the second insulating base material 24 may be any insulating base material used for circuit boards, such as a bismaleimide triazine resin, which is a thermosetting resin, or a modified polyphenylene ether resin, which is a thermoplastic resin, for example.

The second insulating base material 24 is in a semi-cured state, and the second metal layer 28 formed on the second surface 22b of the first insulating base material 22 is embedded in the second insulating base material 24.

Figure 18:
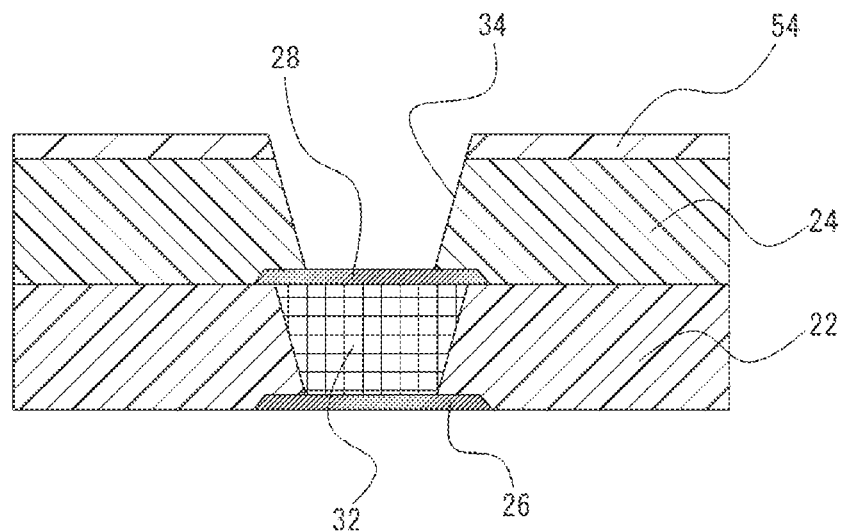
FIG. 18 is a schematic cross-sectional view (No. 17) showing an example of the method for manufacturing a circuit board.

FIG. 18 shows a state in which the through hole 34, which extends through the second insulating base material 24 in the thickness direction, is formed. The through hole 34 extends through the second insulating base material 24 and the resin film 54. The second metal layer 28 closes the bottom of the through hole 34. As a method for forming the through hole 34, a forming method using a laser is available, but the method is not limited to the forming method using a laser. Examples of types of laser that may be used to form the through hole 34 with laser include CO2 laser and YAG laser, and the laser type can be selected as appropriate. Also, there is no limitation to the laser output, and the output may be selected as appropriate.

Figure 19:
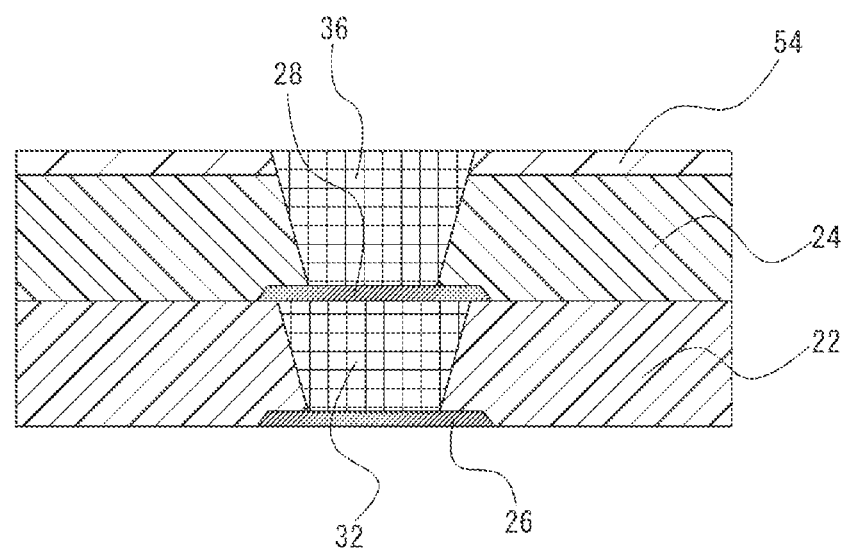
FIG. 19 is a schematic cross-sectional view (No. 18) showing an example of the method for manufacturing a circuit board.

FIG. 19 shows a state in which the through hole 34 is filled with the second conductive paste 36. The second conductive paste 36 may be of the same material as the first conductive paste 32. As the second conductive paste 36, paste containing a conductive filler and a binder resin may be used. Examples of conductive fillers include particles of metals such as copper, gold, silver, palladium, nickel, tin, and bismuth. These metal particle types may be used alone or in combination of two or more. As the binder resin, an epoxy resin, which is a type of thermosetting resin, may be used, for example. However, the material is not limited to epoxy resin, and polyimide resin or the like may be used. Also, the binder resin may be a thermoplastic resin instead of a thermosetting resin.

Examples of a method of filling the through holes 34 with the second conductive paste 36 include a method of filling the through holes 34 with the second conductive paste 36 under atmospheric pressure or under vacuum using a jig such as a squeegee.

Figure 20:
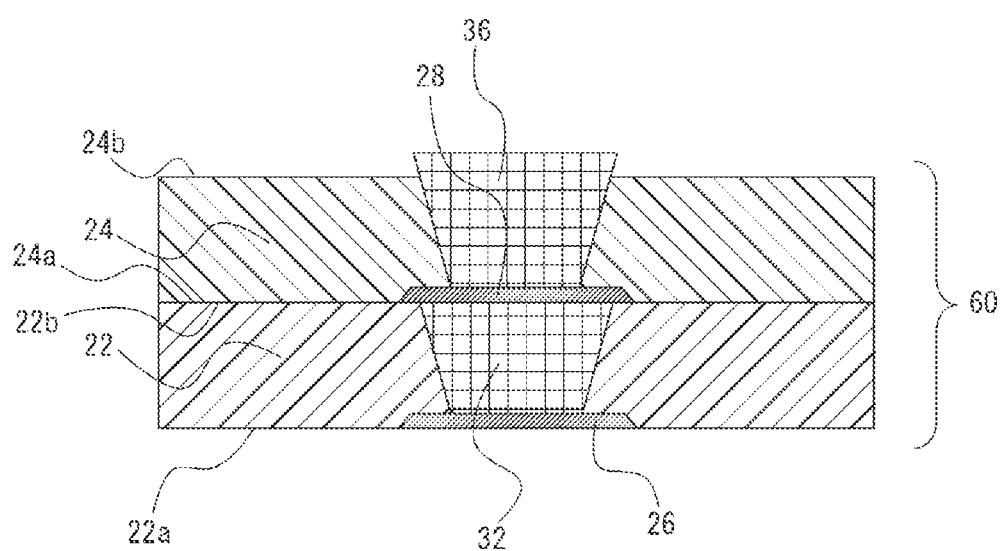
FIG. 20 is a schematic cross-sectional view (No. 19) showing an example of the method for manufacturing a circuit board.

FIG. 20 shows a state in which the resin film 54 on the surface of the second insulating base material 24 is peeled off. When the resin film 54 is peeled off, the second conductive paste 36 protrudes from the opening of the surface of the second insulating base material 24 opposite to the first insulating base material 22 by the thickness of the resin film 54.

When the resin film 54 peeled off, one unit component 60, in which the two insulating base materials 22 and 24 are laminated, is completed. The unit component 60 is configured by laminating the cured first insulating base material 22 and the semi-cured second insulating base material 24 laminated on the side of the first insulating base material 22 corresponding to the second surface 22b. The second metal layer 28 is embedded in the second insulating base material 24, and the second conductive paste 36 is also uncured and bulges toward the side corresponding to the second surface 24b of the second insulating base material 24. In the unit component 60, the first metal layer 26, which has a trapezoidal shape in which the side corresponding to the first surface 22a has a large diameter and the diameter decreases from the first surface 22a toward the second surface 22b, is formed at the first surface 22a of the first insulating base material 22, and the second metal layer 28, which has a trapezoidal shape in which the side corresponding to the first surface 24a has a large diameter and the diameter decreases from the first surface 24a toward the second surface 24b, is formed at the second surface 22b of the first insulating base material 22.

The method for manufacturing the circuit board 20 according to the present embodiment manufactures the multilayer circuit board 20 by laminating the multiple unit components 60 shown in FIG. 20. By manufacturing the multiple unit components 60 in advance and laminating these multiple unit components 60 as in the present embodiment can shorten the manufacturing time as compared to a configuration in which one layer is formed at a time as in the build-up type.

Also, as shown in FIGS. 2 to 13, the method for manufacturing the circuit board 20 of the present embodiment disposes the third metal layer 56 and the fourth metal layer 57 in succession on the lower side (opposite to the side where the first insulating base material 22 is laminated) of the first metal foil 40. Thus, it is possible to limit variations in the plate thickness distribution and the flatness of the laminated surfaces, and to prevent misalignment between layers after lamination, leakage of the conductive paste, voids, and the like.

Figure 21:
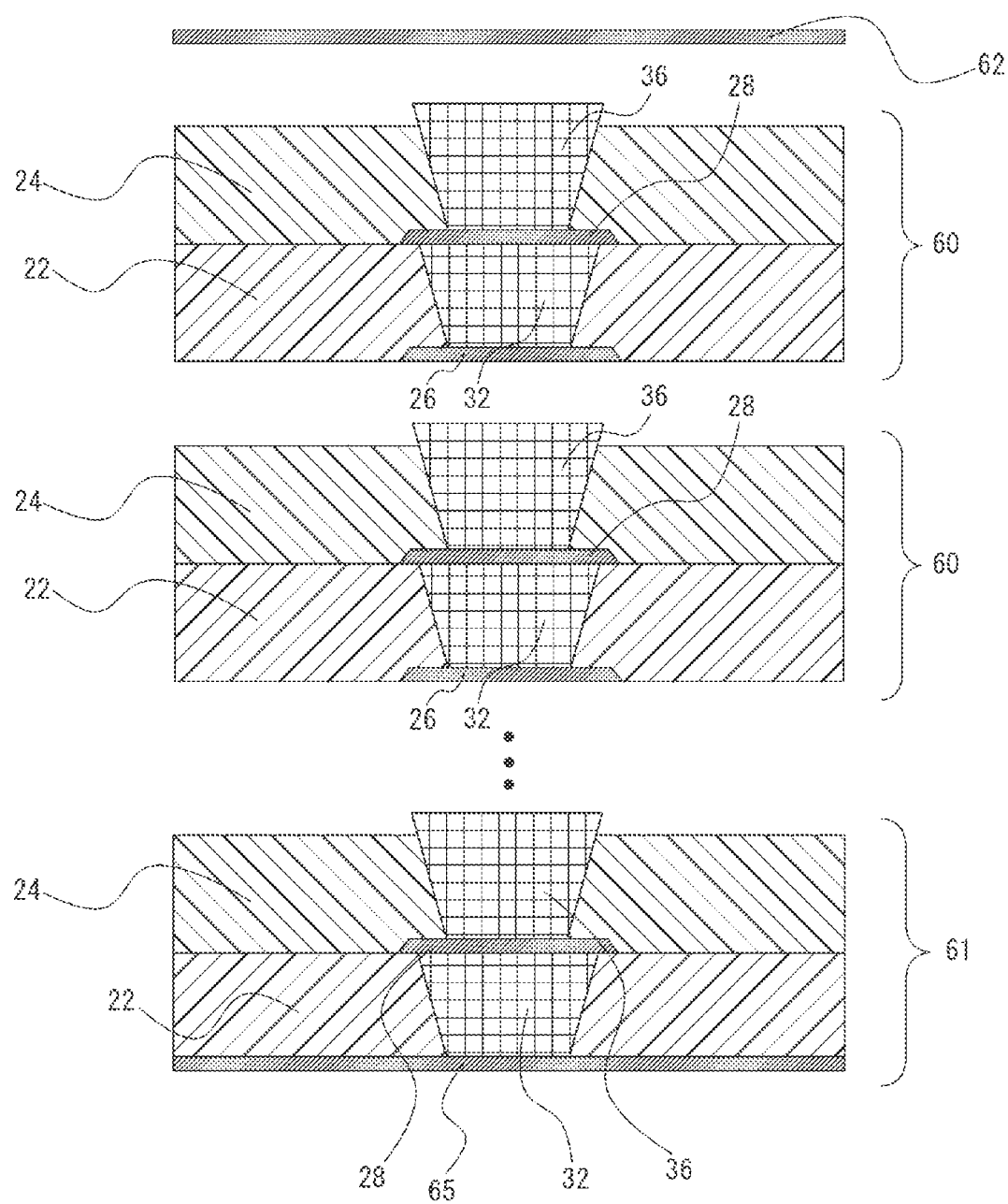
FIG. 21 is a schematic cross-sectional view (No. 20) showing an example of the method for manufacturing a circuit board.

FIG. 21 shows a state in which multiple unit components 60 and one unit component 61 are laminated. To laminate the multiple unit components 60 and the one unit component 61, the semi-cured second insulating base materials 24 of the unit components 60, 61 are joined to the cured first insulating base materials 22 of other unit components 60. As will be described below, the unit component of the lowest layer is the unit component 61, which is different in structure from the unit components 60.

The manufacturing process of the unit component 61, which is the lowest layer in the laminate of the multiple unit components 60 and 61, is now described. The unit component 61 in the lowest layer is manufactured by placing a fifth metal foil 65 in place of the first metal foil 40 shown in FIG. 2 and directly laminating the first conductive paste 32 without performing patterning of the fifth metal foil 65. The subsequent manufacturing process for the unit component 61 is the same as the manufacturing process for the unit component 60 shown in FIGS. 7 to 20 and thus not described. In this manner, as shown in FIGS. 21 to 23, the unit component 61 is obtained in which the fifth metal foil 65 is laminated at the entire lowest layer.

If the unit components 60 are laminated after the lowest layer is formed as a product surface, as with the unit component 60, foreign matter may be fused to the first metal layer 26 of the lowest layer, decreasing the yield. Also, if the first metal layer 26 of the lowest layer is patterned before the lamination of the unit components 60, the internal pressure created during the lamination may be dispersed, making it difficult to apply the pressure to the conductive paste and causing abnormality in the electrical resistance value. As such, laminating the unit component 61 at the lowest layer has advantageous effects of preventing the above.

Referring to FIGS. 21 to 25, the manufacturing process of the circuit board 20 in which the multiple unit components 60 and one unit component 61 are laminated are now described. FIGS. 21 to 25 show an example of a six-layer circuit board 20 in which two unit components 60 and one unit component 61 are laminated. First, with the multiple unit components 60 and one unit component 61 laminated, a surface metal layer 62 is placed on the uppermost surface (on the side of the uppermost unit component 60 corresponding to the second insulating base material 24 of the multiple unit components 60). As the surface metal layer 62, copper or the like may be used, but the material is not limited to copper, and other metals can be appropriately selected.

Figure 22:
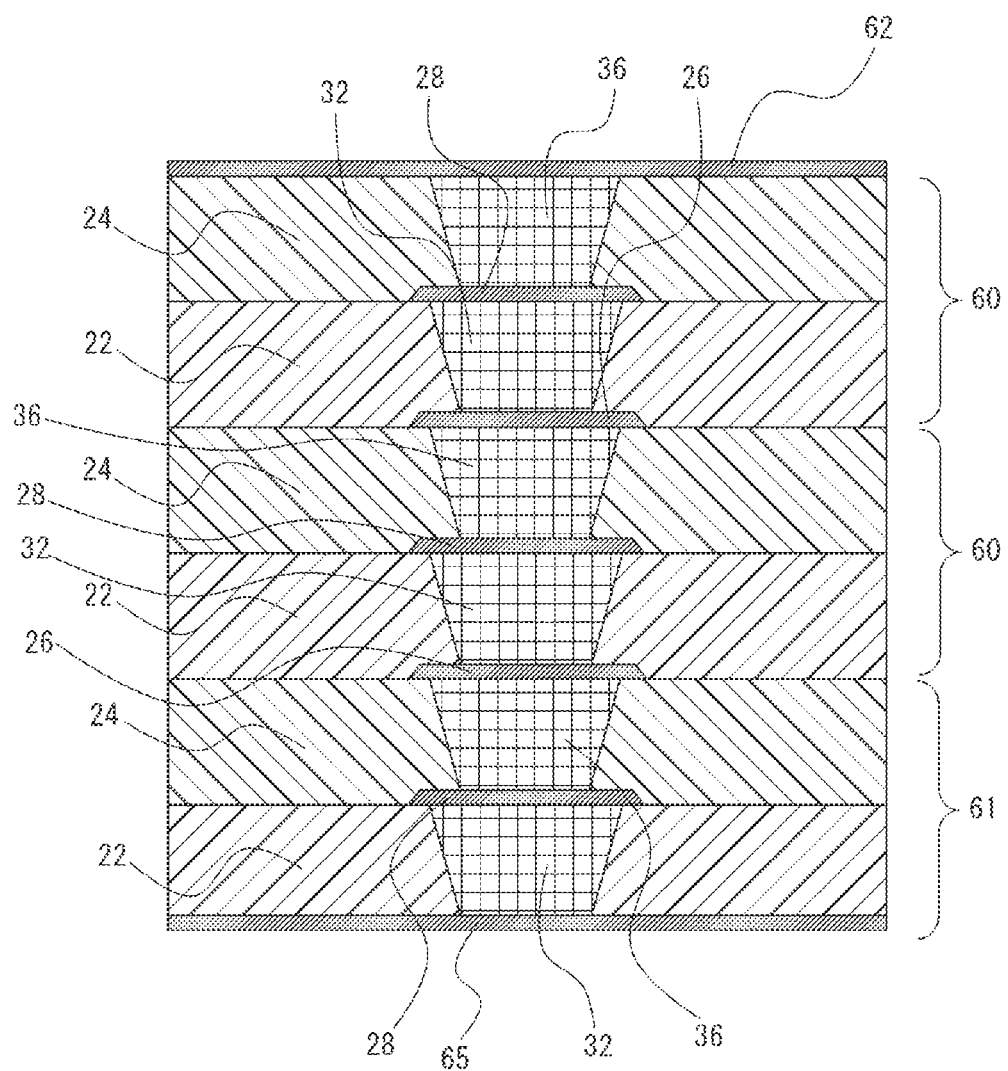
FIG. 22 is a schematic cross-sectional view (No. 21) showing an example of the method for manufacturing a circuit board.
Figure 23:
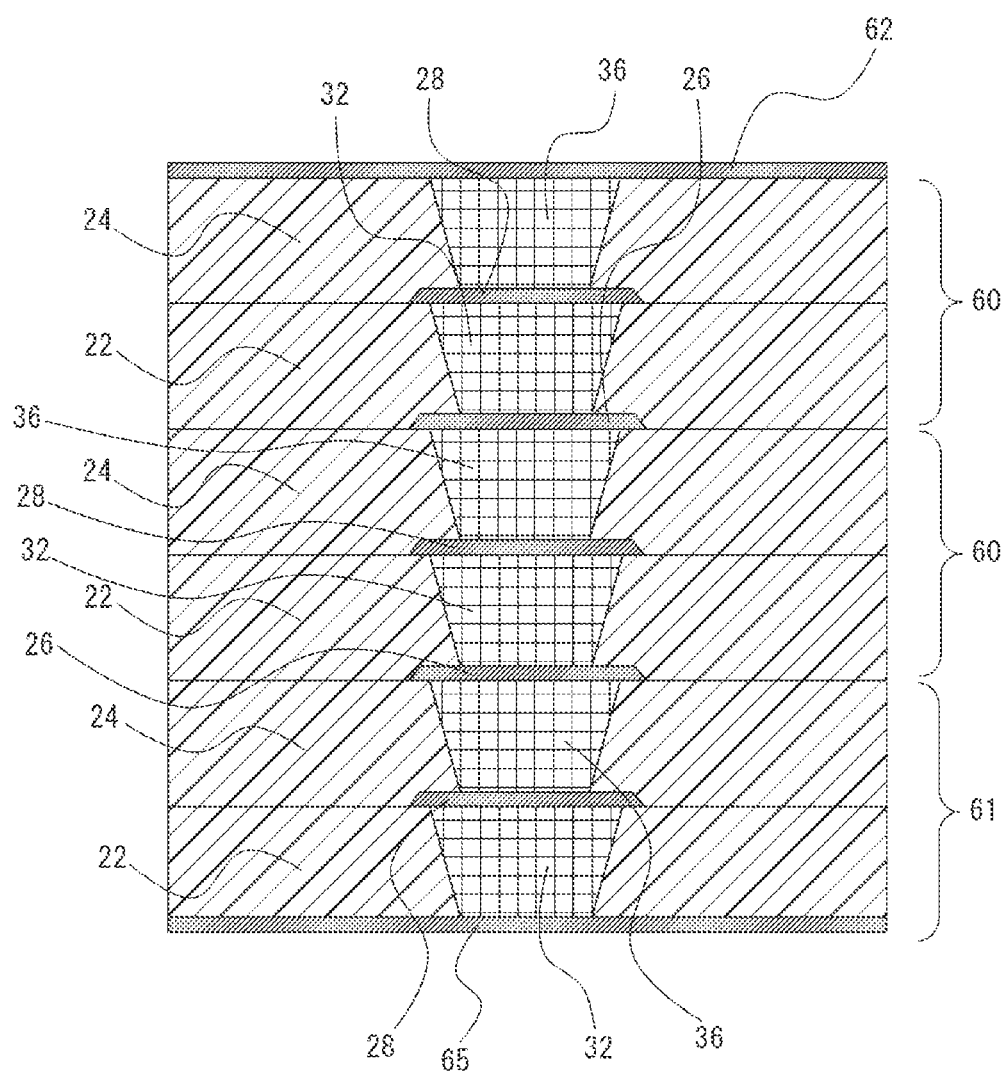
FIG. 23 is a schematic cross-sectional view (No. 22) showing an example of the method for manufacturing a circuit board.

As shown in FIGS. 22 and 23, after the surface metal layer 62 is placed on the uppermost surface, thermocompression bonding or compression bonding is performed on the surface metal layer 62, the multiple unit components 60, and the one unit component 61. The thermocompression bonding or compression bonding cures the second insulating base materials 24 and the second conductive paste 36 of the unit components 60 and 61, joining the unit components 60 and the unit component 61 together. Also, the surface metal layer 62 at the uppermost surface is joined to the second insulating base material 24 of the unit component 60 that is at the uppermost part of the laminated unit components 60. The temperature and pressure for thermocompression bonding and the pressure for compression bonding may be appropriately selected according to the materials of the first conductive paste 32, the first insulating base materials 22, the second conductive paste 36, and the second insulating base materials 24.

Figure 24:
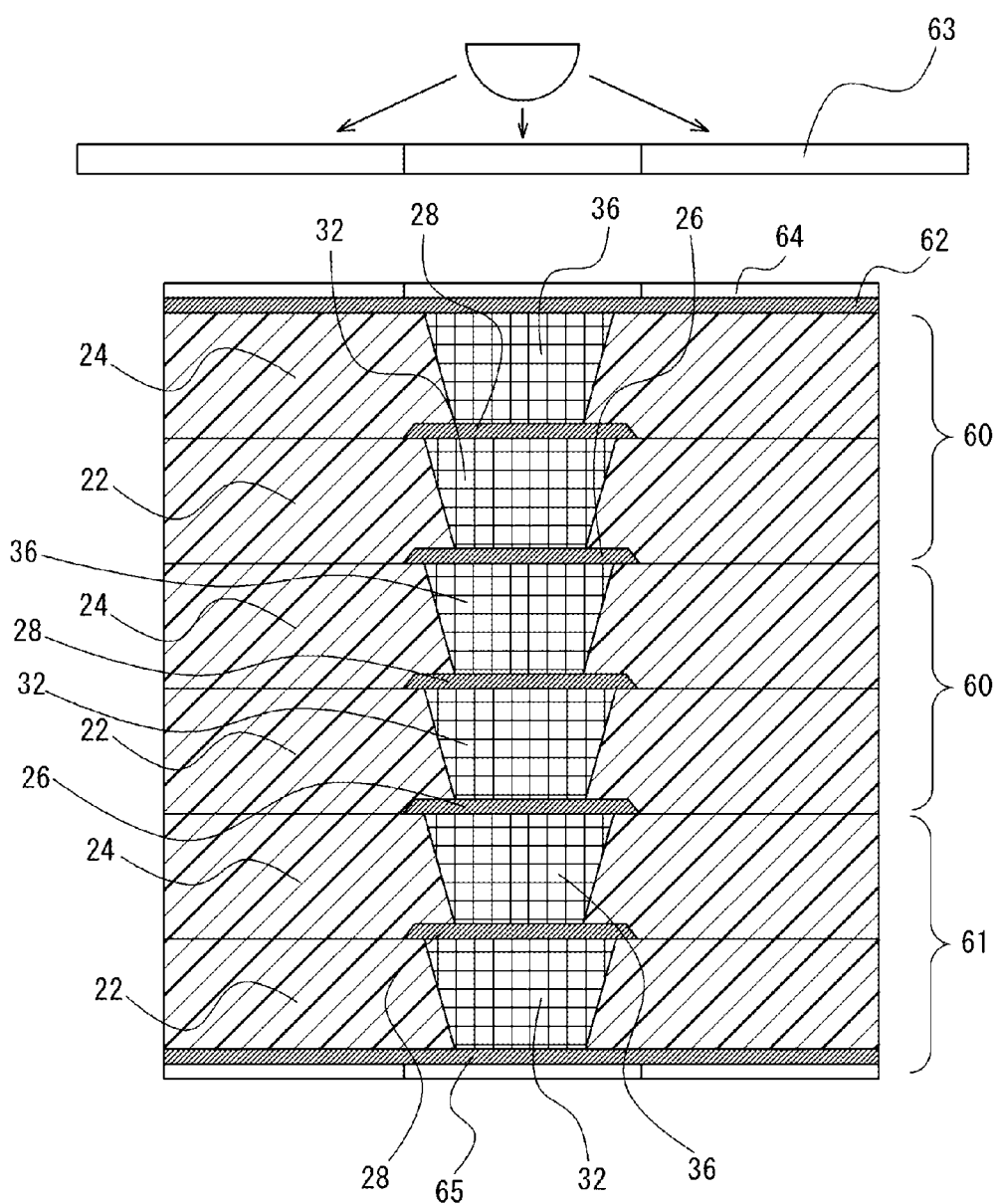
FIG. 24 is a schematic cross-sectional view (No. 23) showing an example of the method for manufacturing a circuit board.

Then, as shown in FIG. 24, the surface metal layer 62 and the fifth metal foil 65 are etched. The etching processing of this embodiment uses wet etching. Dry films 64 are affixed to the surface of the surface metal layer 62 and the surface of the fifth metal foil 65, the dry films 64 are exposed and developed through a photomask 63 to obtain the surface metal layer 62 formed as a predetermined pattern and the fifth metal layer 66.

Figure 25:
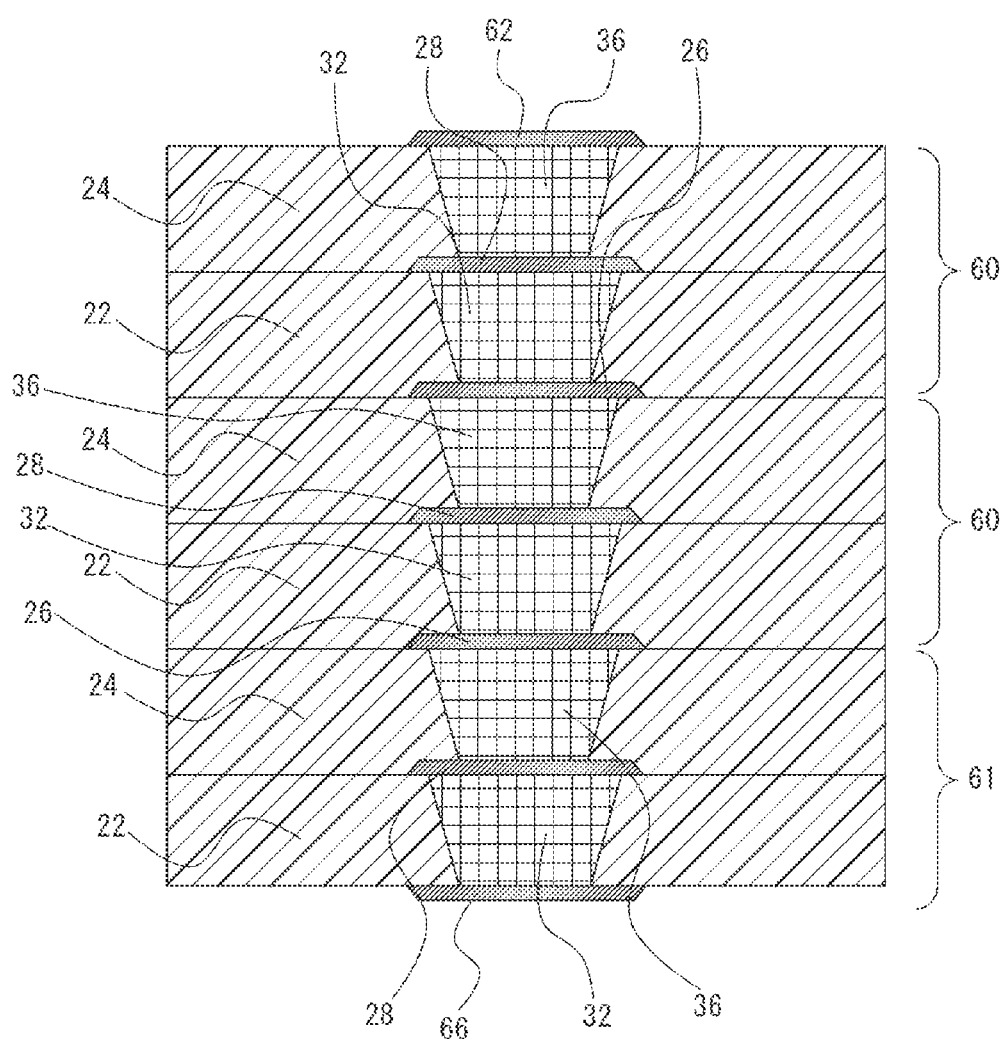
FIG. 25 is a schematic cross-sectional view (No. 24) showing an example of the method for manufacturing a circuit board.

As shown in FIG. 25, in the manufactured multilayer circuit board 20, the insulating base materials 22 and 24 are joined together without an adhesive layer. This is because the semi-cured second insulating base materials 24 are joined to the first insulating base materials 22 during the manufacturing of the unit components 60 and the unit component 61, and, when multiple unit components 60 and one unit component 61 are laminated, the first insulating base materials 22 and the semi-cured second insulating base materials 24 are bonded through thermocompression bonding or compression bonding, and the second conductive paste 36 and the first metal layers 26 are bonded by thermocompression bonding or compression bonding. Also, the manufacturing process provides a configuration in which the first metal layers 26 are embedded in the first insulating base materials 22, the second metal layers 28 are embedded in the second insulating base materials 24, and the fifth metal layer 66 is exposed from the first insulating base material 22.

The trapezoidal metal layers 26 and 28 formed in the multilayer circuit board 20 are arranged such that their trapezoidal shapes are uniformly in the same orientation. That is, in the multilayer circuit board 20, the first metal layers 26 and the second metal layers 28 are uniformly arranged in the same orientation, and the sides of the first metal layers 26 and the second metal layers 28 with the small diameter in the trapezoidal shape face toward the upper side of the multilayer circuit board. The side of the fifth metal layer 66 with the small diameter in the trapezoidal shape faces toward the lower side of the multilayer circuit board, and thus the fifth metal layer 66 is in the orientation that is reversed from the orientation of the metal layers 26 and 28.

The circuit board 20 manufactured by the method for manufacturing a circuit board of the present embodiment and the circuit board 20 of the present embodiment can be used as motherboards (supporting substrates) and also interposers (relay substrates). In particular, they can be used as motherboards and interposers of server systems and high-speed communication systems, and can also be used as circuit boards constituting semiconductor elements. They are also applicable to an inspection device, a probe card, and the like used to determine the quality of semiconductors.

In the present embodiment, a configuration has been described in which the three-layer metal includes the third metal layer 56 and the fourth metal layer 57 arranged in succession under the first metal foil 40. However, a sixth metal layer (not shown) containing a metal different from the first metal foil 40 may also be advantageously provided under the fourth metal layer 57. In this case, a process of removing the sixth metal layer, which is the lowest layer, by etching may be added at the beginning of the processes described in the above embodiment.

(Electronic Device)

The electronic device has the above-described circuit board 20, electronic components (not shown), and other members as necessary. Examples of the electronic device include smartphones, tablet-type mobile terminals, and computers.

What is claimed is:

1. A method for manufacturing a circuit board, comprising:
    a process of manufacturing a first metal layer being formed into a pattern shape by disposing, on a surface of a first metal foil that is opposite to a surface on which a first insulating base material is to be laminated, a third metal layer containing a metal that is different from the first metal foil and a fourth metal layer in succession and etching the first metal foil from a direction in which the first insulating base material is laminated;
    a process of removing a portion of the third metal layer by etching from the direction in which the first insulating base material is laminated;
    a process of manufacturing a cured first insulating base material in which the first metal layer being formed into a pattern shape is disposed at a first surface, a second metal layer being formed into a pattern shape is disposed at a second surface, and a first through hole that is formed between the first metal layer and the second metal layer is filled with a first conductive paste that connects the first metal layer and the second metal layer;
    a process of removing the entire fourth metal layer by etching;
    a process of removing the entire third metal layer by etching;
    a process of manufacturing a unit component including the first insulating base material and a semi-cured second insulating base material that is disposed on a side of the first insulating base material corresponding to the second surface and in which a second through hole communicating with the second metal layer is filled with a second conductive paste connected to the second metal layer; and
    a process of laminating a plurality of unit components by joining to one another the first insulating base material of one of the plurality of the unit components and the second insulating base material of another unit component of the plurality of the unit components.

2. The method for manufacturing the circuit board according to claim 1 further comprising:
    a process of performing surface roughening on a surface of the first metal layer on which the first insulating base material is to be laminated and a surface of the fourth metal layer on which the first insulating base material is to be laminated such that an arithmetic average roughness (Ra) of the surface of the first metal layer and the surface of the fourth metal layer is 1.0 μm to 2.0 μm; and
    a process of performing surface roughening on a surface of the first metal layer on which the second insulating base material is to be laminated and a surface of the second metal layer on which the second insulating base material is to be laminated such that an arithmetic average roughness (Ra) of the surface of the first metal layer and the surface of the second metal layer is 1.0 μm to 2.0 μm.

3. The method for manufacturing the circuit board according to claim 1, wherein first metal layer is formed into a trapezoidal shape in which a diameter decreases from a side corresponding to the first surface of the first insulating base material toward a side corresponding to the second surface, and
    the second metal layer is formed into a trapezoidal shape in which a diameter decreases from a side corresponding to the first surface of the second insulating base material toward a side corresponding to the second surface.

4. The method for manufacturing the circuit board according to claim 1, wherein the first metal layer of the unit component is embedded in the first insulating base material, and the second metal layer of the unit component is embedded in the second insulating base material in the process of manufacturing the unit component.

* * * * *